United States Patent [19]

Lu

[11] Patent Number: 5,504,711
[45] Date of Patent: Apr. 2, 1996

[54] BIT LINES WRITE CIRCUIT FOR SRAM MEMORIES

[76] Inventor: Hsindao Lu, 3308 Foxboro Dr., Richardson, Tex. 75082

[21] Appl. No.: 315,455

[22] Filed: Sep. 30, 1994

[51] Int. Cl.$^6$ .................................................. G11C 7/00
[52] U.S. Cl. ...................... 365/189.11; 365/190; 365/156
[58] Field of Search ................................ 365/189.11, 190, 365/156, 203, 154

[56] References Cited

U.S. PATENT DOCUMENTS

| | | | |
|---|---|---|---|
| 5,121,356 | 6/1992 | Park | 365/189.01 |
| 5,245,579 | 9/1993 | Ohta | 365/190 |
| 5,291,447 | 3/1994 | Kodama | 365/190 |

Primary Examiner—A. Zarabian
Attorney, Agent, or Firm—John D. Crane; James C. Kesterson; Richard L. Donaldson

[57] ABSTRACT

The write circuit for SRAM memories of this invention includes on each column select line B1,B1' a N-type transistor (N1, N2) which is utilized to drive the voltage on one of the column select lines to $V_{cc}-V_t$. A pull-up circuit circuit is also provided with each column select line B1, B1'which includes a P-type transistor (P1,P2) which is coupled to the supply $V_{cc}$. This circuit raises the voltage which appears between the two column select lines B1, B1' to $V_{cc}$ which is used to write data to a SRAM cell 10, 12 disposed therebetween.

4 Claims, 1 Drawing Sheet

BIT LINES WRITE CIRCUIT FOR SRAM MEMORIES

FIELD OF THE INVENTION

This invention relates generally to the field of static random access memory devices (SRAM) and particularly to a write circuit for use in SRAM devices.

BACKGROUND OF THE INVENTION

In the field of volatile memories, devices which are used to store binary data, many types of memory cells have been widely used. Two frequently used memory cells include the DRAM and SRAM cell. The former is a dynamic random access memory which is a storage device that needs to be refreshed periodically in order to preserve the data stored therein. The latter is a static random access memory which is a storage device which retains its state so long as power is applied. It does not need to be refreshed as a DRAM does.

The typical DRAM cell consists of a single transistor and a capacitor with the state of the charge on the capacitor representing the data stored in the cell. In the typical SRAM, the cell consists of 6 transistors configured to form a latch. The state of the latch represents the data stored in the cell.

The write circuitry for a typical DRAM consists of a pair of signals acting on the transistor, one being known as a word line (row) signal and the other being a bit line signal. In the SRAM cell, there is a single word line but there are two complementary bit lines (column) required to write data into the cell. This is simply due to the fact that the SRAM cell may have to be forced to change state by the signals applied thereto. The cell thereafter will remain at the state to which the cell had been forced. Because of this requirement to force a state change in a multi-transistor latch, the time and power required to produce a state change in a SRAM cell is greater than for a typical DRAM.

As is well known, memory cells are sensitive to certain forms of radiation which may cause a state change. This problem has been addressed in many ways including using error detection and correction schemes. In the case of SRAM devices, another approach to making the memory cell less sensitive to radiation has been to design the cell in a manner that requires the application of higher power to the cell in order to force it to change state. Logically, this approach should work because the typical radiation encountered in military, aircraft and satellite applications is high enough so that cell design changes can readily make the cell much more difficult to change state. As a result, the cell becomes harder to change from one state to another and typically takes longer than for SRAM cells which are more radiation sensitive.

SUMMARY OF THE INVENTION

In view of the foregoing and other problems associated with radiation insensitive SRAM devices, it is an objective of the present invention to provide a write circuit for use with SRAM devices which speeds the writing to a radiation insensitive SRAM cell compared to the speed obtained using prior art write circuits.

In achieving this and other objects, advantages and features of the present invention, a write circuit is provided which has two separate circuits. The first circuit acts to raise the voltage on one bit line to a voltage of $V_{cc}-V_t$. The second circuit acts to raise the voltage on that one bit line from a voltage of $V_{cc}-V_t$ to $V_{cc}$. The other bit line to the cell being written to is simultaneously driven to ground potential. As such, the highest possible voltage is applied across the cell being selected to assure that it will switch state as quickly as is possible.

DETAILED DESCRIPTION

Figure 1:
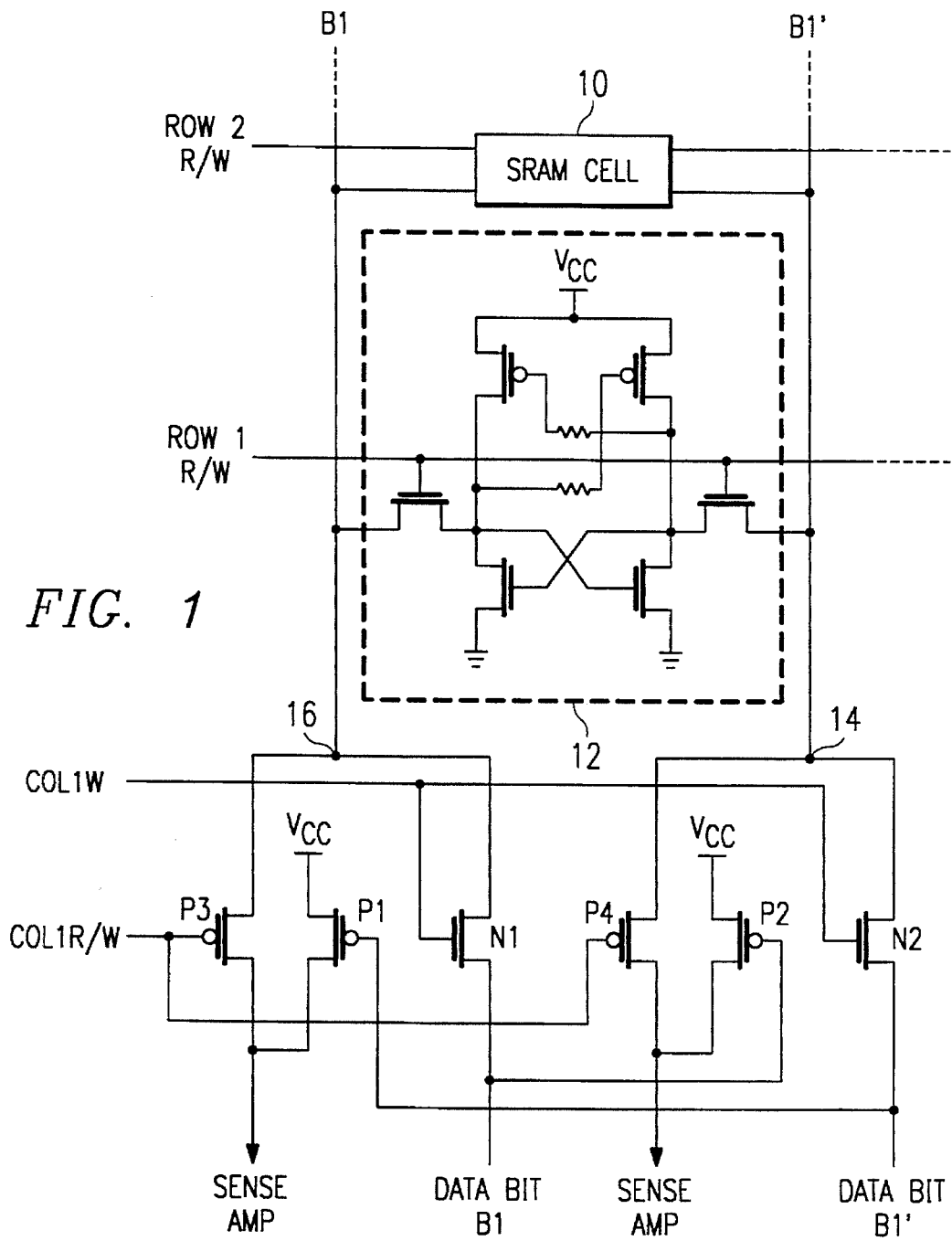
FIG. 1 illustrates a schematic diagram of the write circuit of the present invention coupled to a conventional SRAM cell.

The write circuit of the present invention is illustrated in FIG. 1. This circuit is utilized in configurations where there are a plurality of SRAM cells 10 and 12 with a plurality of other cells arranged in a grid so that there are a plurality of rows and columns. SRAM cells 10 and 12 are merely representative of two such cells disposed in adjacent rows in the same column of cells. It should also be noted that the SRAM cell 10 is shown in block diagram form while SRAM cell 12 illustrates the well known detailed implementation of a radiation resistant SRAM cell using CMOS technology.

Each SRAM cell is connected to a single row select line (word line) and to a pair of column select lines (bit line). In particular, cell 12 is connected to the Row 1 R/W (row 1 read/write) line which goes high whenever a cell in row 1 is either to be read or written to. The cell 12 is also connected to the column lines B1 and B1'. The line B1 is connected at node 16 to the source/drain of a first N type transistor N1. The drain/source of transistor N1 is connected to the Data Bit B1 line. The gate of transistor N1 is connected to the column 1 write line Col 1 W.

Figure 2:
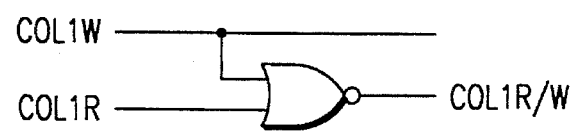
FIG. 2 illustrates a simple circuit for creating the signal Col 1 R/W used by the circuit of FIG. 1.

Node 16 is also connected to the source/drain of transistor P3. Transistor P3 has its drain/source connected to a sense amplifier (not shown) and to the source of transistor P1. The gate of transistor P3 is coupled to the column select line Col 1 R/W which goes low whenever a cell in column 1 of the array of SRAM cells is either read or written to. A circuit for producing this signal is illustrated in FIG. 2. The signal Col 1 R/W at a low level is easily produced by the circuit of FIG. 2 when either the Col 1 W (column 1 write) or the Col 1 R(column 1 read) lines are high. The drain of transistor P1 is connected to the supply voltage $V_{cc}$ and the gate thereof is connected to the line Data Bit B1'.

The line B1' is connected at node 14 to the source/drain of a second N type transistor N2. The drain/source of transistor N2 is connected to the Data Bit B1' line. The gate of transistor N2 is also connected to the column 1 write line Col 1 W.

Node 14 is also connected to the source/drain of transistor P4. Transistor P4 has its drain/source connected to a sense amplifier (not shown) and to the source of transistor P2. The gate of transistor P4 is coupled to the column select line Col 1 R/W which goes low whenever a cell in column 1 of the array of SRAM cells is either read or written to. The drain of transistor P2 is connected to the supply voltage $V_{cc}$ and the gate thereof is connected to the line Data Bit B1.

In operation the column lines B1 and B1' act in different ways depending on whether the cell is being written or read. In the case of a cell write, the lines B1 and B1' are forced to a given voltage by the write circuit attached thereto with one line being high and the other low. In this fashion, the write circuit will overpower the latch in the SRAM cell and cause it to switch to a state indicated by the state of the voltage on lines B1 and B1'. For example, a binary one being stored in the SRAM cell 12 would have a high signal on lines B1 and Row 1 R/W and a low signal on line B1'. If a binary zero is to be stored in SRAM 12, a high signal would be on lines Row 1 R/W and B1' and a low signal on line B1. When the cell 12 is being read, however, a voltage is not applied onto the lines B1 and B1'. In this case, the voltage representative of the state of the latch in the cell 12 is placed onto the lines B1 and B1' by the N type transistors turned on by the signal Row 1 R/W which will be high during a read operation. The cell state is transmitted through transistors P3 and P4,which are turned on by the signal Col 1 R/W being low during read operations, to a sense amplifier (not shown). During read operations the signal Col 1 W is low.

During a write to any particular cell, the voltage on the lines B1 and B1' becomes important especially as lower voltage systems are developed. Also, when the basic SRAM cell is designed to be more tolerant of radiation, i.e., being "radiation hard", the basic SRAM cell becomes more difficult to overpower in order to change its state. Accordingly, the higher the voltage which appears on line B1 or B1' during a write opearation, the more easily and quickly the state of the SRAM can be changed.

In a conventional configuration, transistors N1 and N2 would each be coupled to a data bit driver. One of the bit drivers would put out a high signal while the other would put out a low signal. Typically the high level on either Data Bit B1 line or Data Bit B1' line is at $V_{cc}$ while the low level is at ground. At the same time, the voltage on the line Col 1 W goes high which causes the transistors N1 and N2 to turn on. Assuming that the data bit for column is a one, the line Data Bit B1 will be high and the line Data Bit B1' will be low. This will cause the voltage at node 14 to go to ground (low) while the voltage at node 16 will go to $V_{cc}-V_t$ (high), where $V_t$ is the voltage drop across transistor N1 when it is conducting and is approximately $V_{cc}/5$ volts in typical situations.

As has been previously pointed out, it is desirable to have the voltage at node 16 as high as possible in order to speed the state switching of the SRAM cell being written. In order to facilitate this, a pull up circuit is provided to increase the voltage at node 16 all the way to $V_{cc}$. This pull up circuit consists of transistors P1 and P3. Transistor P1 is turned on by reason of the fact that the gate thereof is coupled to the Data Bit B1' line which is low. Transistor P3 is turned on because the line Col 1 R/W is also low. Accordingly the voltage $V_{cc}$ is transmitted respectively through transistors P1 and P3 to the node 16 thereby pulling the voltage thereat to $V_{cc}$ from the voltage $V_{cc}-V_t$ which is coupled thereto by transistor N1.

In a similar fashion, if a zero is to be written into an SRAM cell in column 1, the write circuit of this invention causes node 14 to go to $V_{cc}$ and node 16 to ground. This is accomplished in this manner. The zero to be stored is manifest by the fact that Data Bit B1' line is high and Data Bit B1 line is low. When the line Col 1 W goes high, transistor N1 and N2 conduct. Transistor N1 couples node 16 to the ground level signal on line Data Bit B1. Transistor, couples node 14 to $V_{cc}-V_t$. Transistor P2 is turned on by reason of the line Data Bit B1 being low. Transistors P4 and P3 are turned on by Col 1 R/W being low indicating Column is being written. The fact that transistors P2 and P4 are conductive causes the voltage at node 14 to be raised from $V_{cc}-V_t$ to $V_{cc}$.

The above description has placed emphasis on the illustrated implementation of the present invention. Those of skill in the art will realize that numerous modifications may be made to that embodiment without departing from the spirit and scope of the present invention. For example, it is possible to design other pull up circuits to replace those illustrated and described above. Other changes may also be made without departing from the spirit and scope of the present invention as defined in the following claims.

What is claimed is:

1. A write circuit for writing data onto a first and a second column select line in a SRAM memory, where the column select lines have different level signals thereon, at a time when said write circuit is activated by an externally generated column write signal, the circuit comprising, in combination:

a first terminal for receiving a first data signal at a first level and a second terminal for recieving a second data signal at a second level, one said data signal being substantially at a voltage of $V_{cc}$ and the other said data signal being substantially at ground;

a first N-type transistor connected between said first terminal and said first coulumn select line to couple the signal at said first terminal to said first column select line when said column write signal is present;

a second N-type transistor connected between said second terminal and said second coulumn select line to couple the signal at said second terminal to said second column select line when said column write signal is present;

a first pull-up circuit coupled to said second terminal to apply the voltage $V_{cc}$ to said first column select line when said second level is substantially at ground and said column write signal is present; and a second pull-up circuit coupled to said first terminal to apply the voltage $V_{cc}$ to said second column select line when said first level is substantially at ground and said column write signal is present.

2. The write circuit of claim 1 wherein said first pull-up circuit includes a first P-type transistor coupled between the voltage $V_{cc}$ and said first column select line, the gate of said first P-type transistor being coupled to said second terminal and wherein said second pull-up circuit includes a second P-type transistor coupled between the voltage $V_{cc}$ and said second column select line, the gate of said second P-type transistor being coupled to said first terminal.

3. A write circuit for writing data onto a first and a second column select line in a SRAM memory, where the column select lines have different level signals thereon, at a time when said write circuit is activated by an externally generated column write signal, the circuit comprising, in combination:

a first terminal for receiving a first data signal at a first level and a second terminal for receiving a second data signal at a second level, one said data signal being substantially at a voltage of $V_{cc}$ and the other said data signal being substantially at ground;

a first N-type transistor connected between said first terminal and said first column select line to couple the signal at said first terminal to said first column select line when said column write signal is present;

a second N-type transistor connected between said second terminal and said second column select line to couple the signal at said second terminal to said second column select line when said column write signal is present;

a first pull-up circuit coupled to said second terminal to apply the voltage $V_{cc}$ to said first column select line when said second level is substantially at ground and said column write signal is present;

a second pull-Up circuit coupled to said first terminal to apply the voltage $V_{cc}$ to said second column select line when said first level is substantially at ground and said column write signal is present; and wherein said first pull-up circuit includes a first and second P-type transistor coupled in series between the voltage $V_{cc}$ and said first column select line, the gate of said first P-type transistor being coupled to said second terminal and the gate of said second P-type transistor being coupled to said column write signal so as to be conductive when said column write signal is present, wherein said second pull-up circuit includes a third and fourth P-type transistor coupled in series between the voltage $V_{cc}$ and said second column select line, the gate of said third P-type transistor being coupled to said first terminal and the gate of said fourth P-type transistor being coupled to said column write signal so as to be conductive when said column write signal is present.

4. A write circuit for writing data onto a first and a second column select line in a SRAM memory, where the column select lines have different level signals thereon, at a time when said write circuit is activated by an externally generated column write signal, the circuit comprising, in combination:

a first terminal for receiving a first data signal at a first level and a second terminal for recieving a second data signal at a second level, one said data signal being substantially at a voltage of $V_{cc}$ and the other said data signal being substantially at ground;

a first and a second N-type transistor, each with a gate, source and drain, the drain of said first N-type transistor being connected to said first terminal and the drain of said second N-type transistor being connected to said second terminal, the source of said first N-type transistor being connected to said first column select line and the source of said second N-type transistor being connected to said second column select line and the gate of said first and said second N-type transistor being connected to receive said externally generated column write signal;

a first, second, third and fourth P-type transistor, each with a gate, source and drain, the source of said first and second P-type transistors being connected to the voltage of $V_{cc}$, the gate of said first P-type transistor being connected to said second terminal and the gate of said second P-type transistor being connected to said first terminal, the drain of said first P-type transistor being connected to the source of said third P-type transistor and the drain of said second P-type transistor being connected to the source of said fourth P-type transistor, the gate of said third and said fourth P-type transistor being coupled together for receiving the inverse of said externally generated column write signal, source of said third P-type transistor being connected to said first column select line and the source of said fourth P-type transistor being connected to said second column select line.

* * * * *